United States Patent [19]

Kojima et al.

[11] Patent Number: 4,906,885

[45] Date of Patent: Mar. 6, 1990

[54] ELECTRODE MATERIAL FOR SURFACE ACOUSTIC WAVE DEVICES AND SURFACE ACOUSTIC WAVE DEVICE USING THE SAME

[75] Inventors: Hiroomi Kojima, Kamakura; Toyoji Tabuchi, Kodaira; Mitsutaka Hikita, Hachoiji; Kazuhito Kurosawa, Katsuta; Atsushi Sumioka, Kokubunji, all of Japan

[73] Assignees: Hitachi Denshi Kabushiki Kaisha; Hitachi, Ltd., both of Tokyo, Japan

[21] Appl. No.: 247,339

[22] Filed: Sep. 21, 1988

[30] Foreign Application Priority Data

Sep. 22, 1987 [JP] Japan .................. 62-236189

[51] Int. Cl.⁴ .................................... H01L 41/08
[52] U.S. Cl. ....................... 310/313 B; 310/313 R; 310/363; 310/364
[58] Field of Search .............. 310/313, 363, 364; 333/150–155, 193–196

[56] References Cited

U.S. PATENT DOCUMENTS 4,775,814 10/1988 Yuhara et al. .............. 310/313 D X

FOREIGN PATENT DOCUMENTS 57-101413 6/1982 Japan .
0295504 12/1987 Japan .................................. 333/195

OTHER PUBLICATIONS

Improved Metallization for Surface Acoustic Wave Devices, by J. I. Latham et al., Thin Solid Films 64, No. 1, pp. 9–15, May 1979.

Primary Examiner—Mark O. Budd
Attorney, Agent, or Firm—Antonelli, Terry & Wands

[57] ABSTRACT

A surface acoustic wave device has its inter—digital transducers made of a 3—metal alloyed material consisting of aluminum, copper and magnesium.

7 Claims, 8 Drawing Sheets

ELECTRODE MATERIAL FOR SURFACE ACOUSTIC WAVE DEVICES AND SURFACE ACOUSTIC WAVE DEVICE USING THE SAME

BACKGROUND OF THE INVENTION

1. Field of the Invention

This invention relates to a surface acoustic wave device operative in VHF and UHF frequency bands, and particularly to electrode material for thin metal electrodes formed on the substrate surface.

2. Description of the Prior Art

With the intention of replacing the conventional circuits that are combinations of lumped circuit elements, i.e., capacitive elements, resistive elements and inductive elements, there have been developed devices using the surface acoustic wave, particularly resonators, filters, etc., and these devices have already been used in communications equipment and television receivers. The surface acoustic wave devices have such advantages as compactness, high operational stability and less variability of characteristics achieved at low cost.

The principle of the surface acoustic wave filter will first be described. FIG. 1 is a diagram showing the structure of the surface acoustic wave filter. Indicated by 11 is a monocrystalline substrate made o piezoelectric material or nonpiezoelectric material or a ceramic substrate, or the combination of these substrates and a piezoelectric thin film. Provided on the surface of the substrate 11 is an interdigital transducer 12 for input and another interdigital transducer 13 for output. When a voltage is applied to an input terminal 14, a surface acoustic wave 16 is generated and it is propagated toward the output transducer 13. The surface acoustic wave 16 has its amplitude approximately in proportion to the overlap width of finger electrodes and its frequency in inverse proportion to the interval of finger electrode, and the Fourier integration of impulse response in the time domain virtually determines the transfer function of the filter. As a band-pass filter operative in VHF and UHF frequency bands, the structure may be added by the formation of slits or grooves besides the thin metal electrodes on the surface of the substrate 11, but it originates from the completely same principle.

FIG. 2 shows the operation of the transducer. Generally, a positive voltage is applied to the upper terminal 21 of the transducer, while a negative voltage is applied to the lower terminal 22, and consequently the upper finger electrodes and lower finger electrodes vibrate in opposite phase relationship. By applying a negative voltage to the upper terminal 21 and a positive voltage on the lower terminal 22 at the subsequent instance, the vibrations reverse. By repeating the voltage application operation, a surface acoustic wave 16 is produced. The band-pass filter in FIG. 1 has smaller attenuation L in frequency response between specific frequencies f1 and f2 and extremely large attenuation L for other frequencies by introducing the weighting for the synthesization of frequency response, as shown in FIG. 3. However, the band-pass filter of FIG. 1 involves the leakage of propagation toward the outside of the input/output transducers 12 and 13, resulting in a large insertion loss α as shown in FIG. 3, and the filter suffers a large loss in general.

The foregoing surface acoustic wave device is a surface acoustic wave (SAW) filter as an example, and SAW filters for communications equipment are required to have a high frequency capability, low insertion loss and high power capacity. For example, SAW filters used for antenna duplexer of portable telephone are required to operate at an insertion loss below 3 dB and an output of 1.6 watts, preferably. Their lifetime is expected to be at least 2000 hours depending on the frequency of use. Because of this, the development of SAW filters for communications equipment such as portable telephone duplexers is mainly aimed at lower insertion loss and higher power capacity (longer life in operation at high power application). An increase in the insertion loss results in an increased power dissipation within the SAW filter and in a rising temperature of the filter itself, which induces thermal migration and the like. Namely, high power application results in a shorter life, and therefore the reduction of insertion loss is a prerequisite to the achievement of high power capacity.

Conventional SAW filters such as IF (intermediate frequency) filters used for color television sets employ 2-transducer system, i.e., two interdigital transducers (IDTs), for input and output, and suffer large insertion loss. The recent proposals of the unidirectional transducer system, 3-transducer system, multi-transducer system, which is an expansion of the 3-transducer system, and resonator system have improved the insertion loss, and SAW filters with insertion loss below 3 dB are now available.

In operation with high power application as mentioned above, conceivable causes of limiting the life of SAW filters include electrical migration, effects similar to thermal migration, and acoustic migration. Namely, the entry of an electrical signal to a SAW filter creates a stress on the substrate due to the inverse piezoelectric effect, and the stress distorts the IDT electrode formed on the substrate, yielding hillocks and voids.

Electrode material for SAW filters are required to have high electrical conductivity and low density, since an increased resistance of IDT electrode material results in an increased insertion loss of filter and an increase in the density of electrode material impedes the conversion from the electrical signal to the acoustic signal, resulting in deteriorated filter characteristics.

For the electrode material of SAW filters, pure aluminum thin film has been used generally, although it has not provided a satisfactory life for the filters. The following describes the life of SAW filter having IDT electrodes made of pure aluminum thin film, by citing experimental result for a sample filter. The sample filter has a center frequency of 610 MHz and an insertion loss of 1.2 dB, with its remaining parameters being listed in Table 1. The result of power aging test was approximately 240 hours in the operating conditions of a 1.0 watt filter output and 80° C. ambient temperature. The lifetime was calculated using the Arrhenius equation from the result of an accelerated test. It reveals that pure aluminum thin film does not meet the lifetime required of the SAW filter electrode intended for the portable telephone duplexer.

TABLE 1

| | |
|---|---|
| Center frequency | 610 MHz or lower |
| IDT structure | 9 repetition structures, no-weighting |
| IDT aperture length | 18 $\lambda_0$ ($\lambda_0$: wavelength) |
| Substrate material | LiTaO$_3$, 36° rotation Y-cut plate |
| Electrode thickness | 100 nm |
| Insertion loss | 1.2 dB or less (pure aluminum) |

Electrode materials with higher power capacity are described for the case of a Cu-doped aluminum thin film in the article on pp. 9-15 of the publication "Thin Solid Films 64", (1979). The article reports that the use of an aluminum thin film doped by 2% Cu enhanced the life by about 65 times as compared with a pure aluminum thin film. JP-A-57-101413 also discloses the extended life by using a Cu-doped aluminum thin film.

FIG. 4 is a plot of the resistivity of thin film normalized to the value of pure aluminum bulk against the amount of doping (weight %) of Cu in an Al-Cu alloy. The figure also shows the insertion loss of a sample SAW filter against the resistivity of thin film electrode.

FIG. 5 is a plot of the life of the above sample SAW filter operated at a 1.0 watt output and a 80° C. ambient temperature against the amount of doping of Cu in the Al-Cu alloy used for the filter electrode material. The lifetime which was measured in the same manner as mentioned previously, reaches the peak when the Cu doping is 2.5 weight %. The lifetime of about 20,000 hours at a Cu doping of 2.5 weight %, as shown in FIG. 5, must be subjected to a safety factor of around 5-10 if it has been evaluated from the accelerated test, and accordingly the present sample SAW filter has a life of about 4000-2000 hours. However, this lifetime for a 1.0 watt output decreased significantly when the output power was increased beyond 2.0 watts, and it was difficult to attain the intended lifetime.

In co-pending U.S. application (A. Yuhara et al) Ser. No. 2,286 (based on Japanese Patent Application Nos. 61-3428 and 61-46138) filed Jan. 12, 1987 and assigned to the assignee of the present invention, a SAW device is disclosed in which electrodes are formed on a piezoelectric substrate by sputtering and/or the electrodes contain an additive of Cu, Ti, Zn, Mg, Fe, Ni, Cr, Ga, Ge, Sn, Pd or Ta. The above-mentioned applications were published as JP-A-62-163408 on July 20, 2987 and as JP-A-62-204611 on Sept. 9, 1987.

Further, in co-pending U.S. application (A. Yuhara et al) Ser. No. 51,523 (based on Japanese Patent Application No. 61-114540) filed May 19, 1987 and assigned to the assignee of the present invention, a SAW device is disclosed in which electrodes formed on a piezoelectric substrate are in a laminated structure including a layer of aluminum and a layer of an impurity added aluminum layer, the impurity being Ti, Cr, V or Mn. Further, the first layer may have Ti, Cu, Mg, Zn or Ni added thereto.

SUMMARY OF THE INVENTION

A primary object of this invention is to provide an electrode material for SAW devices which is high in conductivity and low in density.

A secondary object of this invention is to provide an electrode material for SAW devices which is high in power capacity.

A tertiary object of this invention is to provide a SAW device having a long life even in the operating condition of high power application.

The above objectives are achieved by using a 3-metal alloyed material of aluminum, copper and magnesium for the electrode material of SAW device.

The aforementioned 3-metal alloyed material has a composition the resistance of which is not much different from that of pure aluminum. A surface acoustic wave device comprises one or more IDTs on a substrate, e.g., a piezoelectric substrate, for propagating the surface acoustic wave, and further includes a reflector and a thin film directional coupler, e.g., multistrip coupler, when necessary. When the IDT, reflector and thin film directional coupler are formed of thin stripes, at least one of them may be of the 3-metal alloyed material, or of course all of them may be of the 3-metal alloyed material. The present invention realizes a high-power, long-life surface acoustic wave device by using thin film stripes of Al-Cu-Mg alloyed material.

These and other objects and advantages of this invention will become more apparent from the following detailed description of specific embodiments thereof and from the accompanying drawings.

DESCRIPTION OF THE PREFERRED EMBODIMENTS

Embodiments of this invention will be described with reference to the drawings.

The thin film electrode for a surface acoustic wave device has its resistivity selected preferably about 1.3 times that of pure aluminum bulk ($2.75 \cdot 10^{-6} \Omega$cm) or less, so that it has little effect on the insertion loss. In order for the thin film electrode to be about 1.3 times the pure aluminum bulk or less in resistivity, it must have a Cu doping below about 3.5 weight %, according to FIG. 4.

Figure 6:
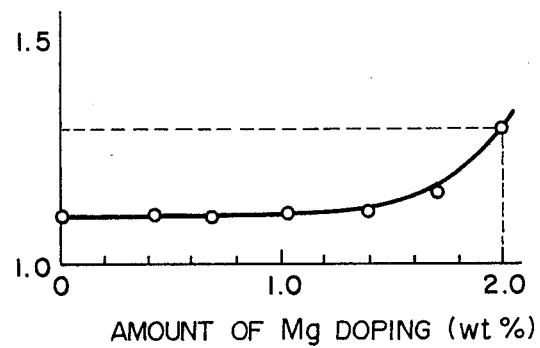
FIG. 6 is a graph showing the resistivity of Al-Mg alloyed thin film against its composition.

FIG. 6 is a plot of the resistivity of thin film normalized to the value of pure aluminum bulk against the doping (weight %) of Mg of Al-Mg alloy. The graph reveals that the upper limit of Mg dope is 2.0 weight % in order for the alloy to be applicable to the electrode material for a SAW filter.

Figure 7:
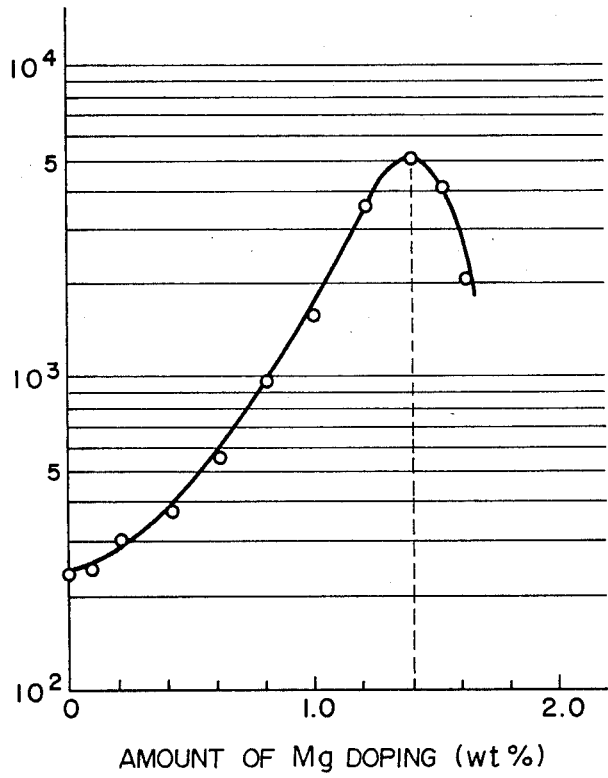
FIG. 7 is a graph showing the lifetime of Al-Mg alloyed thin film against its composition.

FIG. 7 is a plot of the lifetime of the sample SAW filter operated at a 1.0 watt output and a 80° C. ambient temperature against the doping of Mg of Al-Mg alloy used for the filter electrode. The graph reveals that the filter has a maximum life when the Mg doping is 1.4 weight %.

These are the cases in which Cu or Mg is doped in Al, and the following proceeds to a 3-metal alloyed material of Al-Cu-Mg. A 3-metal alloyed material with a y weight % doping of Cu and an x weight % doping of Mg in Al will be expressed as Al-Cu-Mg ($100-x-y$, y, x) in the following.

Figure 8:
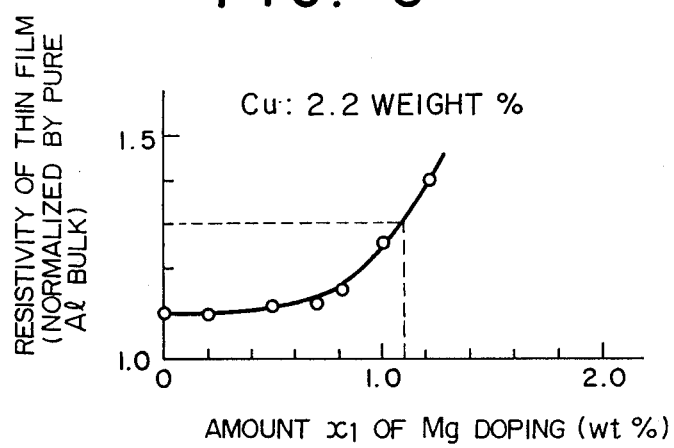
FIG. 8 is a graph showing the resistivity of Al-Cu-Mg alloyed thin film (3-metal alloyed material; Cu : 2.2 weight %) against its composition.

FIG. 8 is a plot of the resistivity of Al-Cu-Mg alloyed thin film normalized to the value of pure Al bulk against the doping $x_1$ (weight %) of Mg, with the Cu doping being fixed to 2.2 weight %, i.e., Al-Cu-Mg ($100-x_1-2.2$, 2.2, $x_1$). The graph reveals that a preferable upper limit of $x_1$ is 1.1 weight % for the electrode material to be used for SAW filters.

Figure 9:
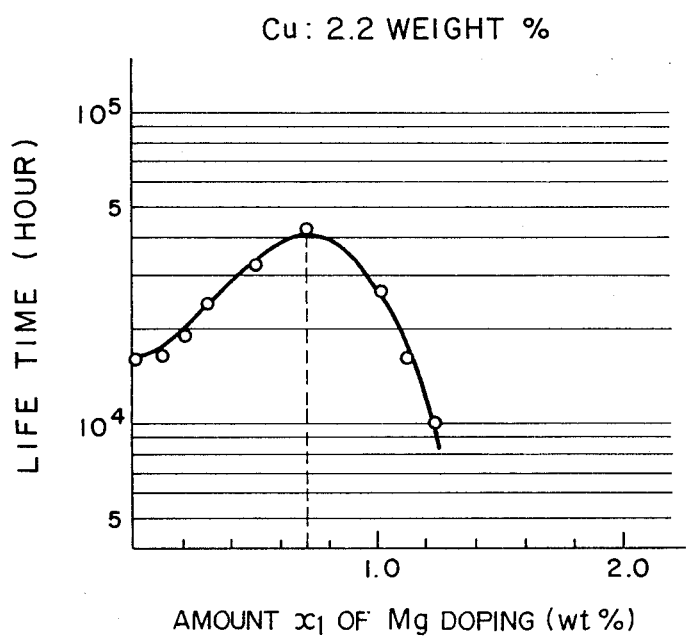
FIG. 9 is a graph showing the lifetime of Al-Cu-Mg alloyed thin film (3-metal alloyed material; Cu : 2.2 weight %) against its composition.

FIG. 9 is a plot of the lifetime of the sample SAW filter using Al-Cu-Mg ($100-x_1-2.2$, 2.2, $x_1$) alloy for the electrode material operated at a 1.0 watt output and a 80° C. ambient temperature against the doping $x_1$ of Mg. The graph reveals that the filter has a maximum life when the Mg doping is 0.7 weight %.

Figure 10:
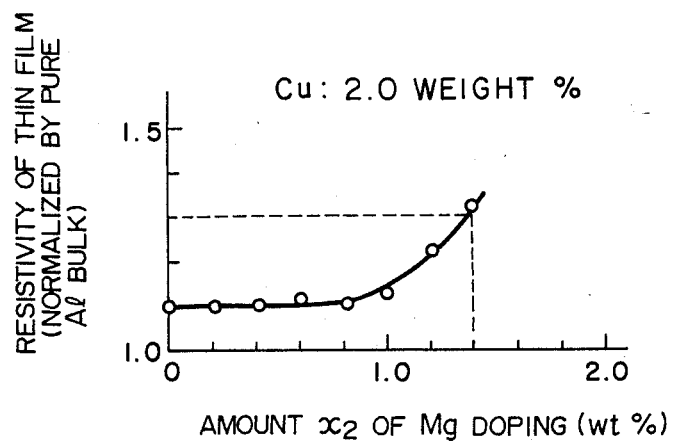
FIG. 10 is a graph showing the resistivity of Al-Cu-Mg alloyed thin film (3-metal alloyed material; Cu ; 2.0 weight %) against its composition.

FIG. 10 is a plot of the resistivity of Al-Cu-Mg alloyed thin film normalized to the value of pure Al bulk against the doping $x_2$ (weight %) of Mg, with the Cu doping being fixed to 2.0 weight %, i.e., Al-Cu-Mg ($100-x_2-2.0$, 2.0, $x_2$). The graph reveals that a preferable upper limit of $x_2$ is 1.4 weight % for the electrode material to be used for SAW filters.

Figure 11:
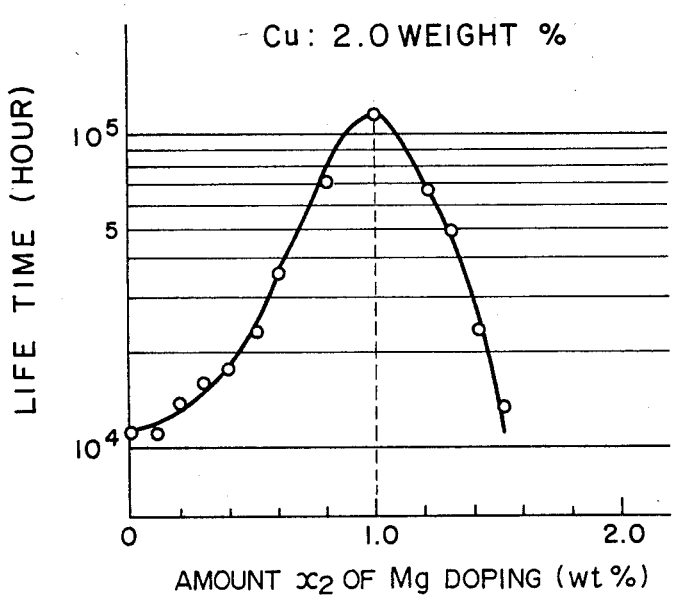
FIG. 11 is a graph showing the lifetime of Al-Cu-Mg alloyed thin film (3-metal alloyed material; Cu : 2.0 weight %) against its composition.

FIG. 11 is a plot of the lifetime of the sample SAW filter using Al-Cu-Mg ($100-x_2-2.0$, 2.0, $x_2$) alloy for the electrode material operated at a 1.0 watt output and a 80° C. ambient temperature against the doping $x_2$ of Mg. The graph reveals that the filter has a maximal life when the Mb doping is 1.0 weight %.

Figure 12:
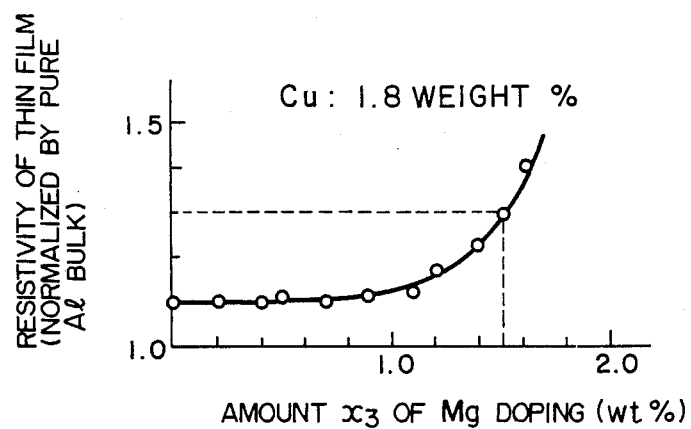
FIG. 12 is a graph showing the resistivity of Al-Cu-Mg alloyed thin film (3-metal alloyed material; Cu : 1.8 weight %) against its composition.

FIG. 12 is a plot of the resistivity of Al-Cu-Mg alloyed thin film normalized to the value of pure Al bulk against the doping $x_3$ (weight %) of Mg, with the Cu doping being fixed to 1.8 weight %, i.e., Al-Cu-Mg ($100-x_3-1.8$, 1.8, $x_3$). The graph reveals that a preferable upper limit of $x_3$ is 1.5 weight % for the electrode material to be used for SAW filters.

Figure 13:
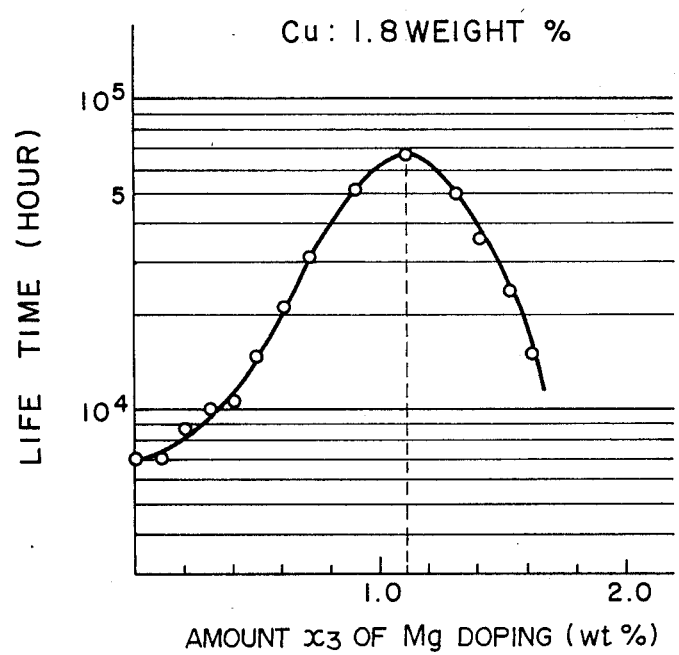
FIG. 13 is a graph showing the lifetime of Al-Cu-Mg alloyed thin film (3-metal alloyed material; Cu : 1.8 weight %) against its composition.

FIG. 13 is a plot of the lifetime of the sample SAW filter using Al-Cu-Mg ($100-x_3-1.8$, 1.8, $x_3$) alloy for the electrode material operated at a 1.0 watt output and a 80° C. ambient temperature against the doping $x_3$ of Mg. The graph reveals that the filter has a maximum life when the Mg doping is 1.1 weight %.

Figure 1:
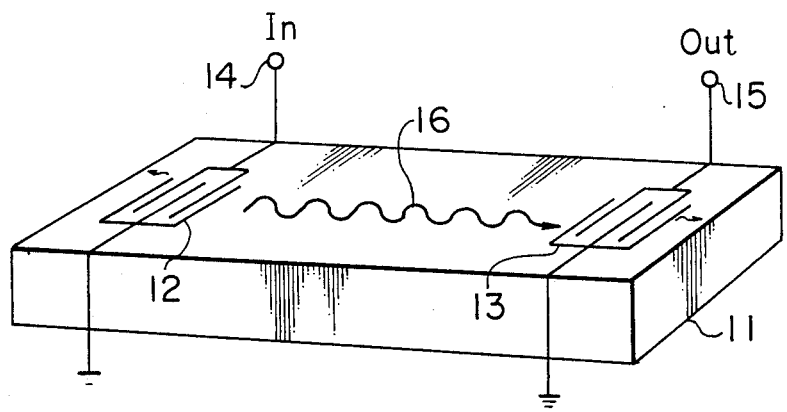
FIG. 1 is a diagram showing the fundamental structure of the conventional SAW filter.
Figure 2:
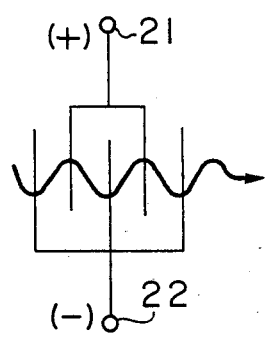
FIG. 2 is a diagram showing the principle of the transducer shown in FIG. 1.
Figure 3:
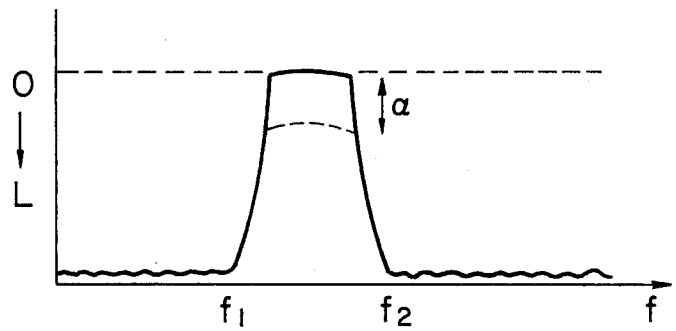
FIG. 3 is a diagram showing the frequency response of the SAW filter shown in FIG. 1.
Figure 4:
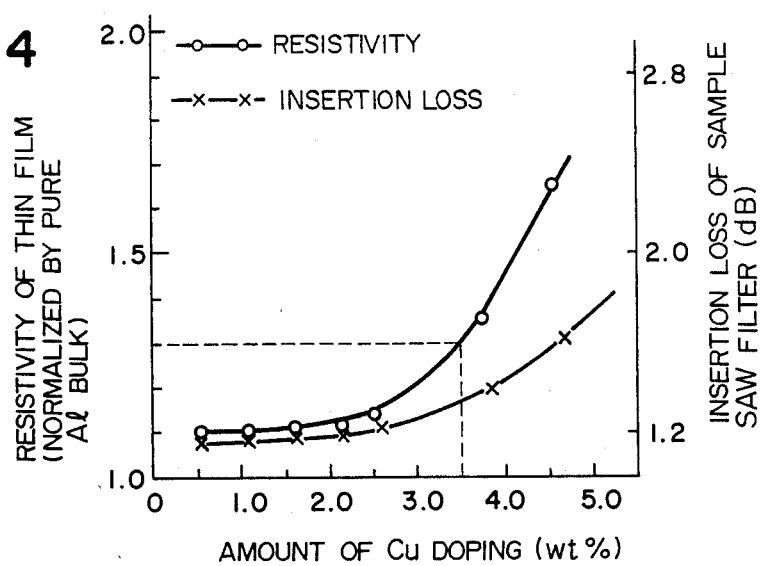
FIG. 4 is a graph showing the resistivity of Al-Cu alloyed thin film against its composition.
Figure 5:
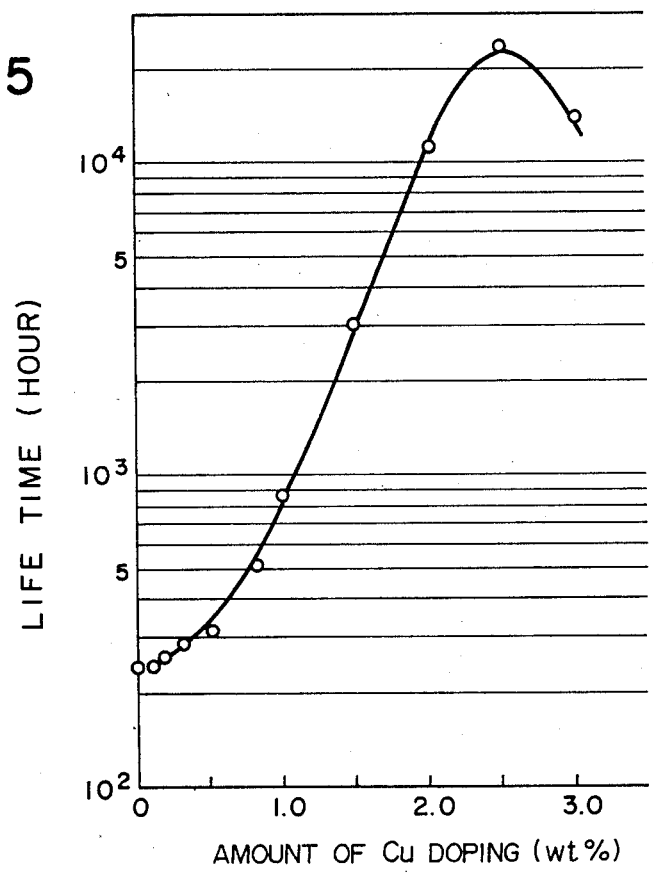
FIG. 5 is a graph showing the lifetime of Al-Cu alloyed thin film against its composition.

The result of the above examination based on FIGS. 4 and 6 concludes that the upper limit of doping of Cu or Mg of Al-Cu-Mg alloy used for the electrode material of SAW filters is 3.5 weight % for Cu, or 2.0 weight % for Mg. With the Cu doping being 2.2 weight % (FIG. 8), the Mg doping has an upper limit of 1.1 weight %; with the Cu doping being 2.0 weight % (FIG. 10), the Mg doping has an upper limit of 1.4 weight %; and with the Cu doping being 1.8 weight % (FIG. 12), the Mg doping has an upper limit of 1.5 weight %. Accordingly, the sum of Cu and Mg must be below 3.3-3.4 weight %. In summary, the Al-Cu-Mg ($100-x-y$, y, x) alloy is required to meet the conditions: $0<y\ 21\ 3.5$, $0<x<2.0$, $0<x+y\leq3.4$.

Figure 14:
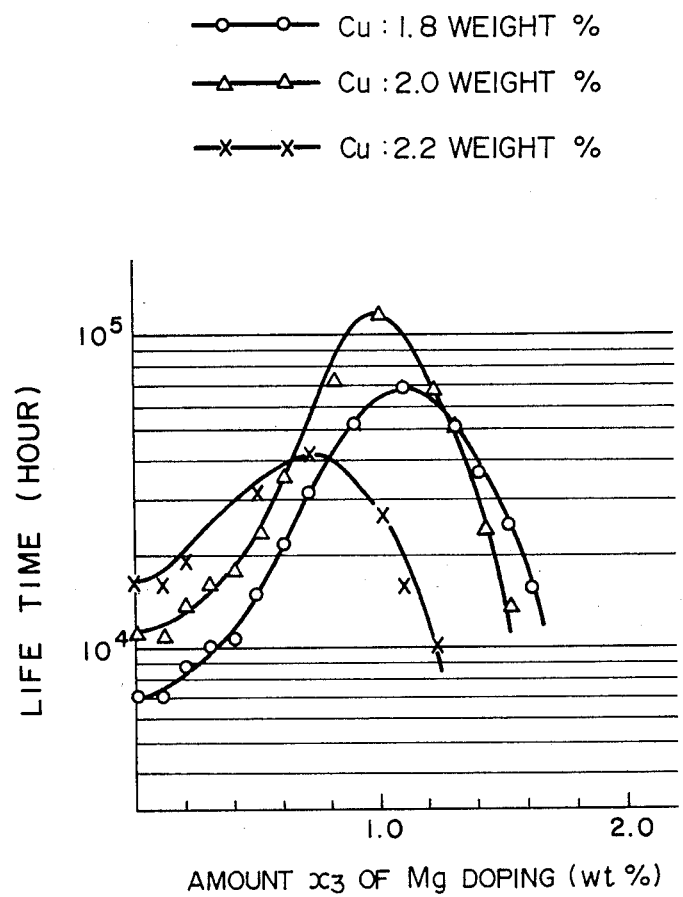
FIG. 14 is a graph showing the lifetime of Al-Cu-Mg alloyed thin film (3-metal alloyed material; Cu : 1.8, 2.0 2.2 weight %) against their composition.

The lifetime will now be reviewed. FIGS. 9, 11 and 13 are summarized in FIG. 14. The life has a peak at a Cu doping of 2.0 weight %, and accordingly the most preferable Cu doping is 1.8-2.2 weight %. The Mg doping is 0.2-1.6 weight % for a lifetime of 20,000 hours, and again the sum of Cu and Mg must be 3.4 weight % or less for the matter of resistivity. In summary, the Al-Cu-Mg ($100-x-y$, y, x) alloy is required to meet the conditions: $1.8\leq y\leq 2.2$, $0.2\leq x\leq 1.6$, $0<x+y\leq 3.4$.

The Al-Cu-Mg alloy has the longest life when Cu and Mg are doped by 2.0 weight % and 1.0 weight %, respectively, and it is about 430 times that of pure aluminum, or about five times that of Al-Cu alloy (97.5, 2.5 weight %), as shown in Table 2.

TABLE 2

| Electrode material (weight %) | Output (w) | Ambient temp. (°C.) | Lifetime (hours) | Lifetime normalized by lifetime using pure Al |
|---|---|---|---|---|
| pure Al | 1.0 | 80 | 238 | 1 |
| Al—Cu (97.5, 2.5) | 1.0 | 80 | 20,360 | ~85 |
| Al—Cu—Mg (97.0, 2.0, 1.0) | 1.0 | 80 | 101,400 | ~430 |

The Al-Cu-Mg alloy has a composition whose resistivity is not much different from that of pure aluminum. The alloy is effective for the prevention of acoustic migration, and a thin film stripe is provided with a long life.

Figure 15A:
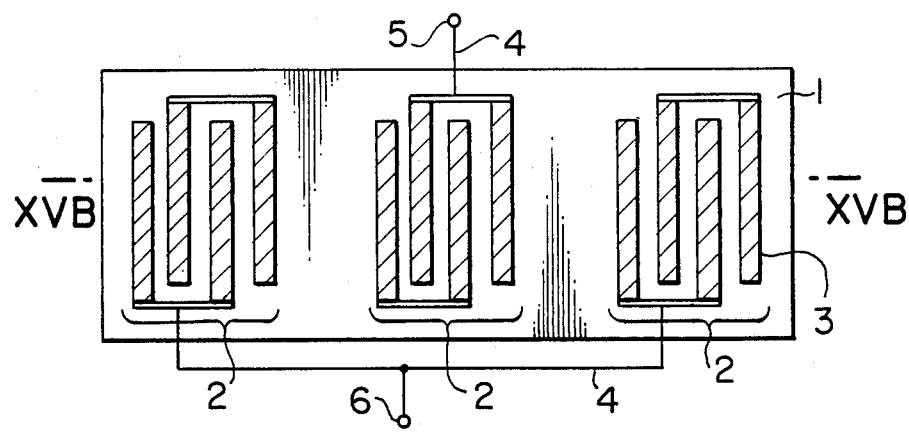
FIGS. 15A, 15B and 16 are diagrams showing SAW filters with their electrodes made of the inventive Al-Cu-Mg alloyed material (3-metal alloyed material).
Figure 15B:
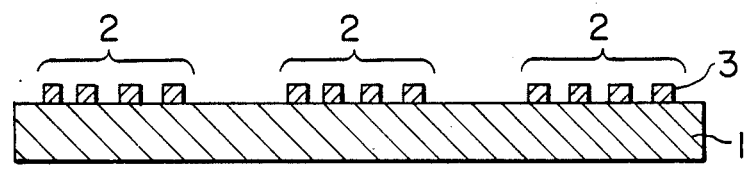

The following describes in detail embodiments of a SAW device using the inventive electrode material. Shown in FIGS. 15A and 15B is a SAW filter embodying the present invention, and it is a 3-transducer SAW filter. FIG. 15A is a plan view, while FIG. 15B is a cross-sectional view taken along the line XVB—XVB of FIG. 15A. Indicated by 1 is a piezoelectric substrate, 2 are IDTs, 3 are strips made of an Al-Cu-Mg (97.0, 2.0, 1.0 weight %) alloy forming the IDTs 2, 4 is a lead wire, and 5 and 6 are terminals.

The inventive Al-Cu-Mg alloyed electrode is also applicable to multi- (three or more) transducer SAW filters, such as the sample SAW filter used in the experiment, besides the one shown in FIG. 15.

Figure 16:
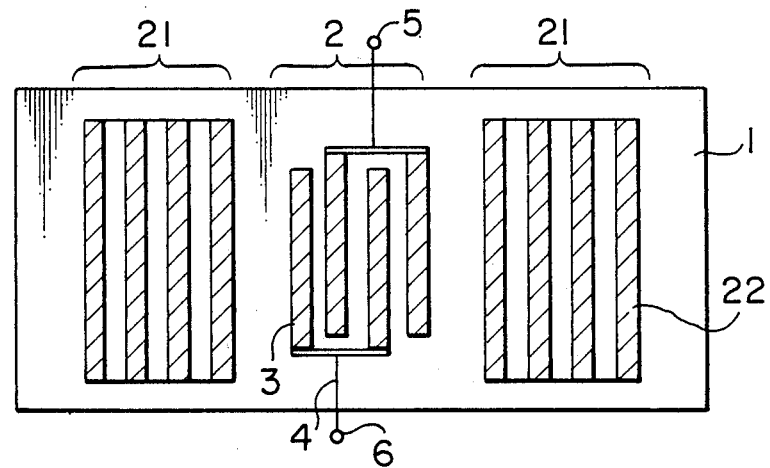

FIG. 16 is plan view of another embodiment of the invention, and it is a 1-port resonative SAW filter. Indicated by 1 is a piezoelectric substrate, 2 are IDTs 21 are grating reflector, 22 and 3 are stripes made of an Al-Cu-Mg (97.0, 2.0, 1.0 weight %) alloy forming the reflector 21 and IDTs 2, 4 is a lead wire, and 5 and 6 are terminals. The inventive Al-Cu-Mg alloy can also be applied to multi-port resonative SAW filters, besides the one shown in FIG. 16.

The embodiments shown in FIGS. 15 and 16 are effective in having a 5-fold life as compared with the device using an Al-Cu alloy.

Although SAW filters have been described, this invention is applicable obviously to other SAW devices such as oscillators.

The inventive 3-metal alloyed thin film stripe can be manufactured by the usual photolithographic techniques including wet etching (chemical etching) such as for pure Al and Al-Cu alloy, and therefore it does not need a dry etching facility or the like.

We claim:

1. An electrode material comprising three-metal alloyed material consisting of aluminum, copper and magnesium, wherein said three-metal alloyed material of aluminum, copper and magnesium has a composition Al-Cu-Mg $(100-x-y, y, x)$ which meets:

$$0 < y < 3.5, \ 0 < x < 2.0 \ 0 < x+y \leq 3.4.$$

2. An electrode material comprising three-metal alloyed material consisting of aluminum, copper and magnesium, wherein said three-metal of aluminum, copper and magnesium, wherein said three-metal alloyed material of aluminum, copper and magnesium has a composition Al-Cu-Mg (100-x-y, y, x) which meets:

$$1.8 \leq y \leq 2.2, \ 0.2 \leq x \leq 1.6, \ 0 < x+y \leq 3.4.$$

3. A surface acoustic wave device having a thin film stripe on a substrate which propagates a surface acoustic wave, wherein said thin film stripe is formed of three-metal alloyed material consisting of aluminum, copper and magnesium, wherein said three-metal alloyed material of aluminum, copper and magnesium has a composition Al-Cu-Mg $(100-x-y, y, x)$ which meets:

$$0 < y < 3.5, \ 0 < x < 2.0, \ 0 < x+y \leq 3.4.$$

4. A surface acoustic wave device according to claim 3, wherein said three-metal alloyed material of aluminum, copper and magnesium has a composition Al-Cu-Mg $(100-x-y, y, x)$ which meets:

$$1.8 \leq y \leq 2.2, \ 0.2 \leq x \leq 1.6, \ 0 < x+y \leq 3.4.$$

5. A surface acoustic wave device according to claim 3, wherein said thin film stripe comprises a thin film stripe which forms an interdigital transducer.

6. A surface acoustic wave device according to claim 3, wherein said thin film stripe comprises a thin film stripe which forms a reflector.

7. A surface acoustic wave device according to claim 3, wherein said thin film stripe comprises a thin film stripe which forms a directional coupler.

* * * * *